US012237173B2

(12) United States Patent
Hada et al.

(10) Patent No.: US 12,237,173 B2
(45) Date of Patent: Feb. 25, 2025

(54) SUBSTRATE PROCESSING METHOD, SUBSTRATE PROCESSING APPARATUS AND SUBSTRATE PROCESSING SYSTEM

(71) Applicant: TOKYO ELECTRON LIMITED, Tokyo (JP)

(72) Inventors: Keiko Hada, Nirasaki (JP); Akitaka Shimizu, Nirasaki (JP); Koichi Nagakura, Nirasaki (JP); Mitsuhiro Tachibana, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1132 days.

(21) Appl. No.: 17/097,466

(22) Filed: Nov. 13, 2020

(65) Prior Publication Data
US 2021/0104412 A1  Apr. 8, 2021

Related U.S. Application Data

(62) Division of application No. 15/402,419, filed on Jan. 10, 2017, now Pat. No. 10,903,083.

(30) Foreign Application Priority Data

Jan. 13, 2016 (JP) .................................. 2016-004719
Sep. 20, 2016 (JP) .................................. 2016-183133

(51) Int. Cl.
*H01L 21/311* (2006.01)
*H01J 37/32* (2006.01)
*H01L 21/67* (2006.01)

(52) U.S. Cl.
CPC .. *H01L 21/31116* (2013.01); *H01J 37/32009* (2013.01); *H01J 37/3244* (2013.01); *H01L 21/67069* (2013.01); *H01L 21/67155* (2013.01)

(58) Field of Classification Search
CPC ......... H01L 21/31116; H01L 21/67069; H01L 21/67155; H01L 21/02049; H01J 37/32009; H01J 37/3244
See application file for complete search history.

(56) References Cited

U.S. PATENT DOCUMENTS 8,058,179 B1   11/2011  Draeger et al.
8,623,765 B2 *  1/2014  Ozawa .............. H01L 21/67201
                                                    156/345.31

(Continued)

FOREIGN PATENT DOCUMENTS

JP   H09036096 A   2/1997
JP   10163127 A    6/1998

(Continued)

OTHER PUBLICATIONS (BOE / HF—Silicon dioxide Etching Standard Operating Procedure by Pauline Stevie 2018) found on web page: https://d 1 rkab 7tlqy5f 1 .cloudfront. net/TNW/ Afdelingen/Quantum%20Nanoscience/ Kavli %20 Nanolab%20Delft/Equipment/BOE-H F%20SOP%20Silicon%20Etching.pdf. (Year: 2018).

(Continued)

*Primary Examiner* — Aiden Lee
(74) *Attorney, Agent, or Firm* — Nath, Goldberg & Meyer; Jerald L. Meyer; Tanya E. Harkins

(57) ABSTRACT

There is provided a substrate processing method which includes: treating a substrate using a fluorine-containing gas; and exposing the substrate to a moisture-containing atmosphere.

5 Claims, 6 Drawing Sheets

(56) References Cited

U.S. PATENT DOCUMENTS

| | | | | |
|---|---|---|---|---|
| 9,613,823 | B2* | 4/2017 | Demichi | H01L 21/0206 |
| 10,903,083 | B2* | 1/2021 | Hada | H01L 21/31116 |
| 2006/0062914 | A1 | 3/2006 | Garg et al. | |
| 2007/0134927 | A1 | 6/2007 | Fortin et al. | |
| 2009/0148348 | A1 | 6/2009 | Pettigrew et al. | |
| 2011/0120650 | A1* | 5/2011 | Asako | H01L 21/67109 |
| | | | | 156/345.27 |
| 2012/0309999 | A1* | 12/2012 | Kiehlbauch | H01L 21/31116 |
| | | | | 556/400 |
| 2014/0357085 | A1* | 12/2014 | Moriya | H01L 21/3065 |
| | | | | 156/345.24 |

FOREIGN PATENT DOCUMENTS

| | | |
|---|---|---|
| JP | 2783485 B2 | 8/1998 |
| JP | 2007243014 A | 9/2007 |
| JP | 2012-532440 A | 12/2012 |

OTHER PUBLICATIONS

Water_phase_diagram found in Web page http://www1.lsbu.ac.uk/water/water_phase_diagram.html (Year: 2000).

* cited by examiner

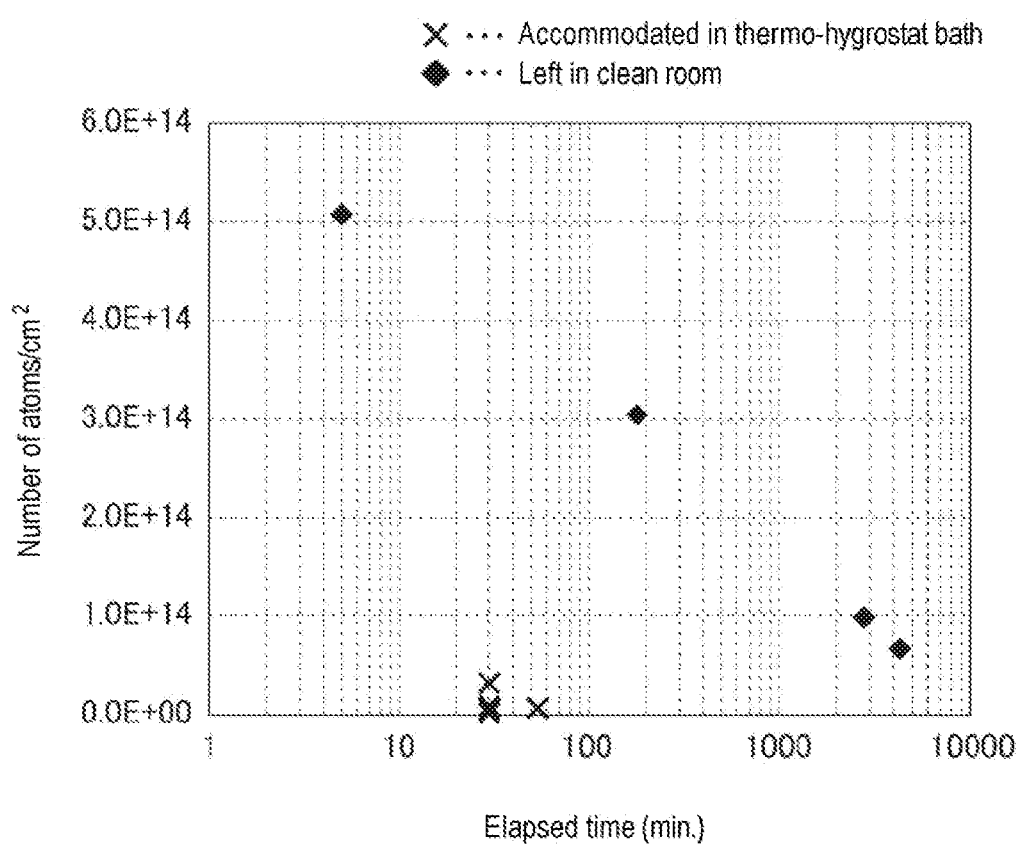

SUBSTRATE PROCESSING METHOD, SUBSTRATE PROCESSING APPARATUS AND SUBSTRATE PROCESSING SYSTEM

CROSS-REFERENCE TO RELATED APPLICATIONS

This is a Divisional Applications of U.S. patent application Ser. No. 15/402,419, filed Jan. 10, 2017, an application claiming benefit from Japanese Patent Application Nos. 2016-004719 and 2016-183133, filed on Jan. 13, 2016 and Sep. 20, 2016, respectively, the content of each of which is hereby incorporated by reference in their entirety.

TECHNICAL FIELD

The present disclosure relates to a substrate processing method, a substrate processing apparatus and a substrate processing system, which remove fluorine remaining on a surface of a substrate.

BACKGROUND

As an example of a process of chemically etching and removing an oxide film formed on a semiconductor wafer (hereinafter, simply referred to as a "wafer") as a substrate, there is known a chemical oxide removal (COR) treatment and a post heat treatment (PHT). In the COR treatment, an oxide film formed on the surface of the wafer reacts with a hydrogen fluoride gas and an ammonia gas such that an ammonium fluorosilicate (AFS) as a reaction product is produced from the oxide film. In the PHT treatment, the AFS thus produced is sublimated and removed by heating the wafer. That is to say, the oxide film is removed through the COR and PHT treatments.

However, fluorine often remains on the surface of the wafer which is subjected to the COR and PHT treatments. Such fluorine corrodes a wiring film formed on the surface of the wafer, thereby deteriorating electrical characteristics of a semiconductor device fabricated using the wafer. Therefore, there is a need to remove fluorine (hereinafter referred to as "residual fluorine") remaining on the surface of the wafer.

As a method of removing the residual fluorine in the related art, there is a process of performing a wet cleaning using a diluted hydrofluoric acid (DHF) or a deionized water (DIW) as a cleaning fluid with respect to a wafer. By performing the wet cleaning on the wafer, it is possible to reduce the number of fluorine atoms remaining on the surface of the wafer up to a level of $10^{12}$ atoms/cm$^2$.

However, with the miniaturization of wirings and the like of a semiconductor device, the width of a pattern formed on a surface of a wafer is decreased at a level of several nanometers. As such, there is a problem that the pattern is collapsed due to a surface tension of the cleaning fluid. To address this, there is proposed a method of removing the residual fluorine using plasma instead of the cleaning fluid. In this method, an oxygen plasma is generated near the surface of the wafer so that fluorine is forcibly substituted and removed by the oxygen plasma.

However, this method requires a mechanism for generating the oxygen plasma. Moreover, a process such as a depressurization is required to generate the oxygen plasma. Such a depressurization process consumes a predetermined period of time, which degrades throughput.

SUMMARY

Some embodiments of the present disclosure provide a substrate processing method, a substrate processing apparatus and a substrate processing system, which can remove a residual fluorine in a simplified configuration without deteriorating throughput.

According to one embodiment of the present disclosure, there is provided a substrate processing method which includes: treating a substrate using a fluorine-containing gas; and exposing the substrate to a moisture-containing atmosphere.

According to another embodiment of the present disclosure, there is provided a substrate processing apparatus including: a process chamber configured to accommodate a substrate subjected to a treatment using a fluorine-containing gas, and a moisture supply mechanism configured to supply moisture to an internal atmosphere of the process chamber.

According to yet another embodiment of the present disclosure, there is provided a substrate processing system including: a substrate processing apparatus for performing a treatment using a fluorine-containing gas with respect to a substrate; and a post-process apparatus configured to expose the substrate, which is subjected to the treatment using the fluorine-containing gas, to a moisture-containing atmosphere.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a graph depicting the number of residual fluorine atoms when a wafer having fluorine existing on a surface thereof is accommodated in a thermo-hygrostat bath.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
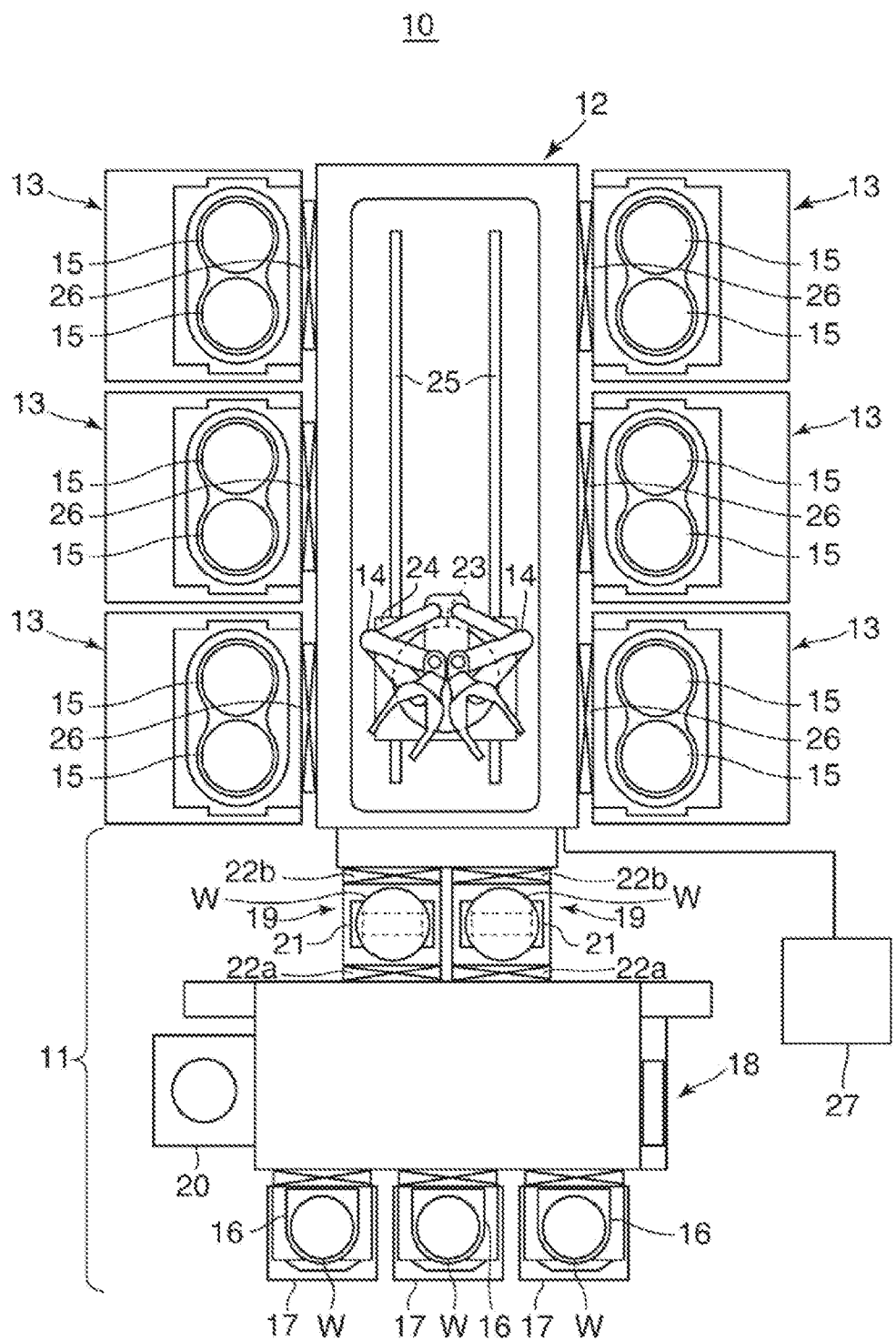
FIG. 1 is a schematic plan view of a substrate processing system according to one embodiment of the present disclosure.

FIG. 1 is a schematic plan view of a substrate processing system according to one embodiment of the present disclosure. For the sake of easier understanding, FIG. 1 is drawn such that some internal structures are revealed.

Referring to FIG. 1, a substrate processing system 10 includes a wafer storage 11 which stores a plurality of wafers W, a transfer module 12 used as a common transfer part configured to simultaneously transfer two wafers W, and a plurality of process modules (substrate processing apparatuses) 13 configured to perform a COR treatment or a PHT treatment with respect to the wafers W transferred from the transfer module 12. The interior of each of the process modules 13 is kept in a vacuum atmosphere.

In the substrate processing system 10, two wafers W selected from among the plurality of wafers W stored in the wafer storage 11 are held by transfer arms 14 of the transfer module 12. The two wafers W are transferred inside the transfer module 12 by moving the transfer arms 14 so that they are mounted on two stages 15 disposed inside the process module 13, respectively. Thereafter, in the process module 13 of the substrate processing system 10, the COR treatment or the PHT treatment is performed on each of the wafers W mounted on the stages 15. Subsequently, the two wafers W subjected to the COR treatment or the PHT treatment are held by the transfer arms 14 and are transferred to the wafer storage 11 by moving the transfer arms 14.

The wafer storage 11 includes three load ports 17 used as loading stands on which respective FOUPs 16 are loaded. The FOUP is a container for storing the plurality of wafers W. Further, the wafer storage 11 includes a loader module 18, two load lock modules 19 and a cooling storage 20. The loader module 18 is configured to receive the wafers W from the FOUP 16 loaded on each of the load ports 17 or to deliver the wafers W which have been subjected to a predetermined process in the process module 13 to the respective FOUP 16. The two load lock modules 19, which are disposed between the loader module 18 and the transfer module 12, temporarily hold the wafers W for delivery of the wafers W. The cooling storage 20 (a substrate processing apparatus or a post-treatment apparatus) is configured to cool the wafers W subjected to the PHT treatment.

The loader module 18 is constituted as a rectangular housing whose interior is kept in an atmospheric environment. The plurality of load ports 17 is arranged in a line along one side constituting a long side of the rectangular housing. Further, the loader module 18 includes a transfer arm (not shown) installed therein, which can be moved in a longitudinal direction of the loader module 18. The transfer arm picks up the wafer W from the FOUP 16 loaded on each of the load ports 17 and transfers the same to the respective load lock module 19, or picks up the wafer W from the respective load lock module 19 and transfers the same to the respective FOUP 16. The FOUP 16 accommodates the plurality of wafers W while stacking them in multi-stage. The interior of the FOUP 16 loaded on each of the load ports 17 is filled with a nitrogen gas or the like and is sealed.

Each of the load lock modules 19 temporarily holds the wafers W accommodated in the FOUP 16 loaded on each of the load ports 17 kept in an atmospheric environment and delivers the same to the respective process module 13 whose interior is kept in a vacuum atmosphere. Each of the load lock modules 19 includes a stocker 21 configured to hold two wafers W. In addition, each of the load lock modules 19 includes a gate valve 22a for securing air-tightness with respect to the loader module 18 and a gate valve 22b for securing air-tightness with respect to the transfer module 12. Further, each of the load lock modules 19 is connected to a gas introduction system (not shown) and a gas exhaust system (not shown) via pipes such that the interior of each of the load lock modules 19 is controlled to be kept in the atmospheric environment or the vacuum atmosphere through the gas introduction system and the gas exhaust system.

The transfer module 12 transfers an unprocessed wafer W from the wafer storage 11 into the process module 13 and transfers a processed wafer W from the process module 13 to the wafer storage 11. The transfer module 12 is constituted as a rectangular housing whose interior is kept in a vacuum atmosphere. The transfer module 12 includes the two transfer arms 14 which are configured to move while holding two wafers W, a rotatable stand 23 configured to rotatably support each of the transfer arms 14, a rotatable mounting stand 24 on which the rotatable stand 23 is mounted, and a guide rail 25 configured to guide the rotatable mounting stand 24 to move in a longitudinal direction of the transfer module 12. Further, the transfer module 12 is communicated with the load lock modules 19 of the wafer storage 11 through the gate valves 22a and 22b, and with the process modules 13 through respective gate valves 26 (to be described later). In the transfer module 12, the transfer arms 14 pick up and hold two wafers W held by the stockers 21 of the load lock modules 19, and transfer the same to the respective process module 13. Further, the transfer arms 14 pick up and hold the two wafers W which have been subjected to the predetermined treatment in the process module 13, and transfer the same to the load lock modules 19. The combination of the rotatable mounting stand 24 and the guide rail 25 constitutes a slide mechanism that moves the rotational stand 23 mounted thereon in the longitudinal direction inside the transfer module 12.

Each of the process modules 13 is communicated with the transfer module 12 through each of the gate valves 26. Thus, by each of the gate valves 26, air-tightness between each of the process modules 13 and the transfer module 12 is secured and the communication between each of the process modules 13 and the transfer module 12 is established. Each of the process modules 13 is connected to a gas introduction system (a gas supply part for supplying a process gas, a purge gas, and the like) (not shown) and a gas exhaust system (provided with a vacuum pump, an exhaust control valve, an exhaust pipe, and the like) (not shown).

Each of the process modules 13 is provided therein with two stages 15 on which two wafers W are arranged and loaded in a horizontal direction. In each of the process modules 13, the two wafers W are arranged and loaded on the two stages 15 such that surfaces of the two wafers W are simultaneously uniformly processed. In this embodiment, each of the process modules 13 performs one of the COR treatment and the PHT treatment.

The substrate processing system 10 further includes a controller 27 used as a control part. The controller 27 controls operations of respective components of the substrate processing system 10 by executing programs stored in a built-in memory or the like.

Figure 2:
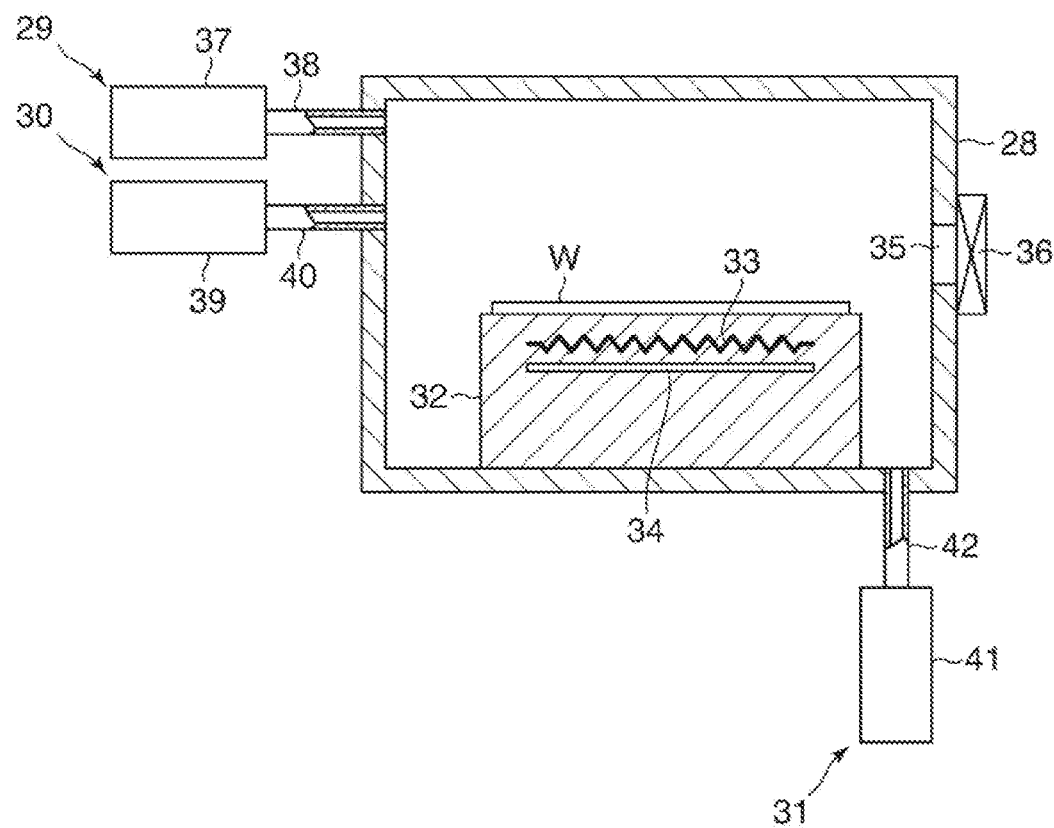
FIG. 2 is a schematic sectional view of a cooling storage shown in FIG. 1.

FIG. 2 is a schematic sectional view of the cooling storage 20 shown in FIG. 1.

Referring to FIG. 2, the cooling storage 20 includes a process chamber 28 in which the wafer W is accommodated, a moisture supply mechanism 29 (a moisture-containing mechanism), an inert gas supply mechanism 30, and an exhaust mechanism 31.

The interior of the process chamber 28 is kept in an atmospheric environment. A stage 32 on which the wafer W is mounted is disposed inside the process chamber 28. The stage 32 incorporates a heater 33 for heating the wafer W mounted on the stage 32 and a cooling channel 34 for cooling the wafer W. The stage 32 regulates a temperature of the wafer W mounted thereon using the heater 33 and the cooling channel 34. The process chamber 28 includes a port 35 as a through-hole formed in a sidewall thereof. The wafer W is carried into and out of the process chamber 28 through the port 35. The port 35 is closed by an openable/closable gate valve 36.

The moisture supply mechanism 29 includes a moisture supply part 37 and a pipe 38, and adds moisture as water vapor to an internal atmosphere of the process chamber 28. The inert gas supply mechanism 30 includes a gas supply part 39 and a pipe 40, and supplies an inert gas, for example, a nitrogen gas, into the process chamber 28. The exhaust mechanism 31 includes an exhaust pump 41 and a pipe 42, and exhausts gas from the interior of the process chamber 28.

In this embodiment, the wafer W is subjected to the PHT treatment. The PHT treatment is a process of sublimating AFS generated on the wafer W through heating. Thus, the temperature of the wafer W subjected to the PHT treatment is high at a level of, for example, about 120 degrees C. The cooling storage 20 cools the wafer subjected to the PHT treatment.

Prior to the present disclosure, the present inventors have found the following fact. In order to find a method adapted to remove a residual fluorine other than a removal method using a wet cleaning or oxygen plasma, the present inventors prepared a plurality of sample wafers on which residual fluorine exists and stored these sample wafers in a clean room for a minute to perform various experiments. As a result, the present inventors found that the number of fluorine atoms remaining on the surface of each of the sample wafers was significantly reduced. Based on the fact that the interior of the clean room was kept in an atmospheric pressure environment and at a suitable humidity, the present inventors estimated that moisture is contributed to the reduction in the number of residual fluorine atoms. Thereafter, the present inventors prepared a plurality of sample wafers on which residual fluorine exists, and accommodated the sample wafers in a thermo-hygrostat bath whose internal temperature and humidity can be controlled, and counted the number of residual fluorine atoms in respective conditions of the internal temperature and humidity of the thermo-hygrostat bath while changing the respective conditions.

FIG. 3 is a graph depicting the number of residual fluorine atoms when a wafer on which residual fluorine exists is accommodated in a thermo-hygrostat bath.

Here, a wafer subjected to the COR treatment and the PHT treatment was used as the wafer W on which the residual fluorine exists. The number of residual fluorine atoms in the wafer W was $5.0 \times 10^{14}/cm^2$. In FIG. 3, the symbol "x" indicates the number of residual fluorine atoms in respective conditions when the internal temperature and humidity conditions of the thermo-hygrostat bath were changed. Further, in the graph of FIG. 3, as comparison data, the symbol "♦" indicates the number of residual fluorine atoms when the wafer W subjected to the COR treatment and the PHT treatment was left in the clean room. In FIG. 3, the horizontal axis of the graph indicates an elapsed time after the wafer W was accommodated in the thermo-hygrostat bath and the remaining time in the clean room. The internal temperature and humidity conditions of the thermo-hygrostat bath were changed as follows: a humidity of 95% at a temperature of 24 degrees C., a humidity of 75% at a temperature of 48 degrees C., a humidity of 80% at a temperature of 48 degrees C., a humidity of 55% at a temperature of 60 degrees C., a humidity of 70% at a temperature of 60 degrees C., and a humidity of 95% at a temperature of 60 degrees C. Even under any conditions, the thermo-hygrostat bath was kept to have a higher inner humidity than the clean room. In addition, the internal temperature of the thermo-hygrostat bath was substantially the same as the temperature of the wafer W. Furthermore, when the wafer W was accommodated in the thermo-hygrostat bath, a period of time of 20 minutes was spent in reaching the respective conditions of the internal temperature and humidity of the thermo-hygrostat bath. Thus, a period of time for which the wafer W was actually processed in the thermo-hygrostat bath under the respective conditions corresponds to a time obtained by subtracting 20 minutes from each time indicated in the horizontal axis of the graph of FIG. 3.

As shown in the graph of FIG. 3, when the wafer W was left in the clean room, a considerable amount of time (about 72 hours) was required to reduce the number of residual fluorine atoms up to a level of $10^{12}/cm^2$ (hereinafter referred to as a "reference level of the number of residual fluorine atoms"), which is the number of fluorine atoms existing on a surface of the wafer W not subjected to any treatment. On the other hand, when the wafer W was exposed to a high humidity atmosphere in the thermo-hygrostat bath, a period of time of about 10 minutes was required to reduce the number of residual fluorine atoms up to the reference level of the number of residual fluorine atoms.

However, a saturating amount of moisture in the air varies depending upon temperature. Thus, the present inventors thought that the reduction in the number of residual fluorine atoms depends on an amount of moisture in the air. Upon reference to the foregoing, the present inventors summarized in Table 1 as to the amount of moisture and the number of residual fluorine atoms under each of the aforementioned respective conditions when the wafer W was exposed to a high moisture atmosphere in the thermo-hygrostat bath.

TABLE 1

| Temperature (degrees C.) | Amount of moisture (g/m³) | | | | | | |
|---|---|---|---|---|---|---|---|
| | 12 | 20.7 | 56.6 | 60.4 | 71.4 | 90.9 | 123.4 |
| 24 | 5.07E+14 | 3.18E+13 | — | — | — | — | — |
| 40 | — | — | — | — | — | — | — |
| 45 | — | — | — | — | — | — | — |
| 47 | — | — | — | — | — | — | — |
| 48 | — | 2.29E+14 | 8.14E+12 | 5.22E+12 | — | — | — |
| 49 | — | — | — | — | — | — | — |
| 50 | — | — | — | — | — | — | — |
| 60 | — | 2.41E+14 | — | — | 6.60E+12 | 7.47E+12 | 1.65E+12 |

As shown in Table 1, it can be seen that, when the amount of moisture in the air is 20 g/m³ or more (except for the case in which the amount of moisture in the air is 20.7 g/m³ and the temperature is 48 degrees C. and the case in which the amount of moisture in the air is 20.7 g/m³ and the temperature is 60 degrees C.), the number of residual fluorine atoms may be reduced up to a level of $10^{13}/cm^2$, and when the amount of moisture in the air is 50 g/m³ or more, the number of residual fluorine atoms may be substantially reduced up to the reference level of the number of residual fluorine atoms.

The reason why the number of residual fluorine atoms is significantly reduced with increase in amount of moisture in the air could not be clearly described. However, the present inventors observed a procedure in which the number of residual fluorine atoms is reduced, and made the following hypothesis.

Figure 4A:
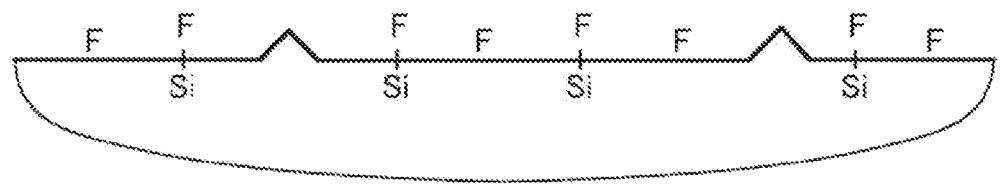
FIGS. 4A to 4D are process views illustrating a process in which the number of residual fluorine atoms is decreased in one embodiment of the present disclosure.

First, a single element of fluorine is present on the surface of the wafer W subjected to the COR treatment and the PHT treatment, and silicon exposed from the surface of the wafer W by removal of an oxide film is terminated by fluorine (FIG. 4A).

Figure 4B:
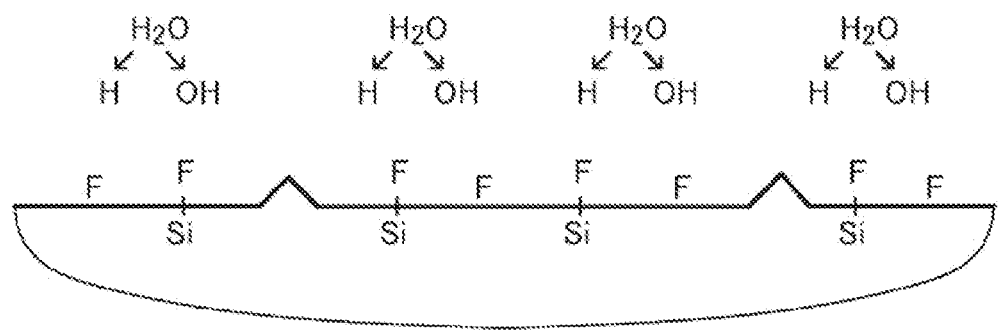
Figure 4C:
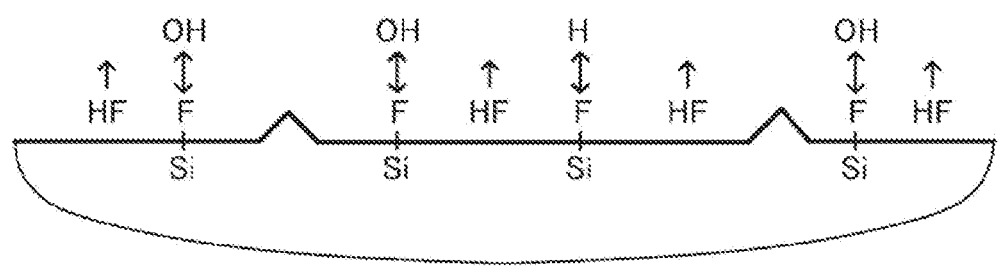
Figure 4D:
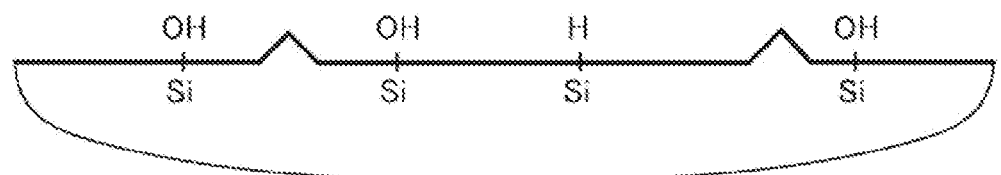

Thereafter, the surface of the wafer W is exposed to a moisture-containing atmosphere, that is to say, a high humidity atmosphere. Then, some moisture in the atmosphere is divided into hydrogen or hydroxyl group (FIG. 4B). At this time, hydrogen is coupled to the single element of fluorine to form a hydrogen fluoride, which in turn is sublimated. Further, the silicon-terminating fluorine existing on the surface of the wafer W is substituted with hydrogen or hydroxyl group and is then removed (FIG. 4C). As a result, the number of residual fluorine atoms on the surface of the wafer W is significantly reduced. Thereafter, silicon on the surface of the wafer W is terminated by hydrogen or hydroxyl group and is stabilized (FIG. 4D).

In the aforementioned counting of the number of residual fluorine atoms the internal temperature of the thermo-hygrostat bath has been described to be substantially the same as that of the wafer W. However, thereafter, as a result of counting the number of residual fluorine atoms under a condition that the temperature of the wafer W is lower than the internal temperature of the thermo-hygrostat bath, moisture in the atmosphere was condensed on the surface of the wafer W to generate a dew formation. The generation of the dew formation may collapse the pattern on the Wafer W due to a surface tension of the condensed moisture. On the other hand, to prevent the generation of the dew formation requires setting the temperature of the wafer W to be higher than the internal temperature of the thermo-hygrostat bath. Therefore, from the viewpoint of securely preventing the collapse of the pattern on the wafer W, it is desirable that the wafer W is heated such that the temperature of the wafer W is higher than the internal temperature of the thermo-hygrostat bath, that is to say, the temperature of the atmosphere.

On the other hand, when the temperature of the wafer W is higher than the temperature of the atmosphere, it becomes difficult for moisture to adhere to the surface of the wafer W so that the coupling between hydrogen and fluorine or the substitution of the silicon-terminating fluorine with the hydroxyl group on the surface of the wafer W does not sufficiently proceed, unlike the case described in FIGS. 4A to 4D. As a result, the number of residual fluorine atoms is not substantially reduced. For example, when the wafer W subjected to the COR treatment and the PHT treatment is exposed to an atmosphere having the same amount of moisture, the number of residual fluorine atoms varies depending upon whether or not the wafer W is heated. Specifically, as shown in Table 2, the number of residual fluorine atoms when the wafer W was heated is greater than the number of residual fluorine atoms when the wafer W was not heated.

TABLE 2

| Amount of moisture (g/m³) | Heating of wafer | Number of residual fluorine atoms |
| --- | --- | --- |
| 46.9 | No | 3.1E+13 |
|  | Yes | 5.0E+13 |
| 67.7 | No | 6.7E+12 |
|  | Yes | 1.1E+13 |

In view of the forgoing, in order to find an upper limit of the temperature of the wafer W, the present inventors measured the number of residual fluorine atoms existing on the wafer W subjected to COR and PHT treatments by changing the temperature of the wafer W and subsequently exposing the wafer W to an atmosphere having a predetermined amount of moisture (for example, 88.5 g/m³). As a result, it can be seen that, as shown in the following Table 3, when a difference in temperature between the wafer W and the atmosphere (the internal temperature of the thermo-hygrostat bath) is about 100 degrees C., the number of residual fluorine atoms was not reduced up to the reference level of the number of residual fluorine atoms, whereas, when a difference in temperature between the wafer W and the atmosphere is about 50 degrees C., the number of residual fluorine atoms was reduced up to the reference level of the number of residual fluorine atoms.

TABLE 3

| Internal temperature of thermo-hygrostat bath (degrees C.) | Amount of moisture (g/m³) | Temperature of wafer (degrees C.) | Number of residual fluorine atoms |
| --- | --- | --- | --- |
| 55 | 88.5 | 100 | 8.4E+12 |
| 55 | 88.5 | 150 | 1.5E+13 |

In addition, the present inventors thought that, even when the wafer W is heated, the coupling between hydrogen and fluorine or the substitution of the silicon-terminating fluorine with the hydroxyl group on the surface of the wafer W is promoted with an increase in the amount of moisture in the atmosphere. Thus, the present inventors counted the number of residual fluorine atoms when changing the amount of moisture in the atmosphere to which the wafer W subjected to COR and PHT treatments is exposed. This result is shown in a graph of FIG. 5. Here, the temperature of the wafer W was set to 100 degrees C. by heating the wafer W and the temperature of the atmosphere (the internal temperature of the thermo-hygrostat bath) was set to 55 degrees C. to 75 degrees C.

Figure 5:
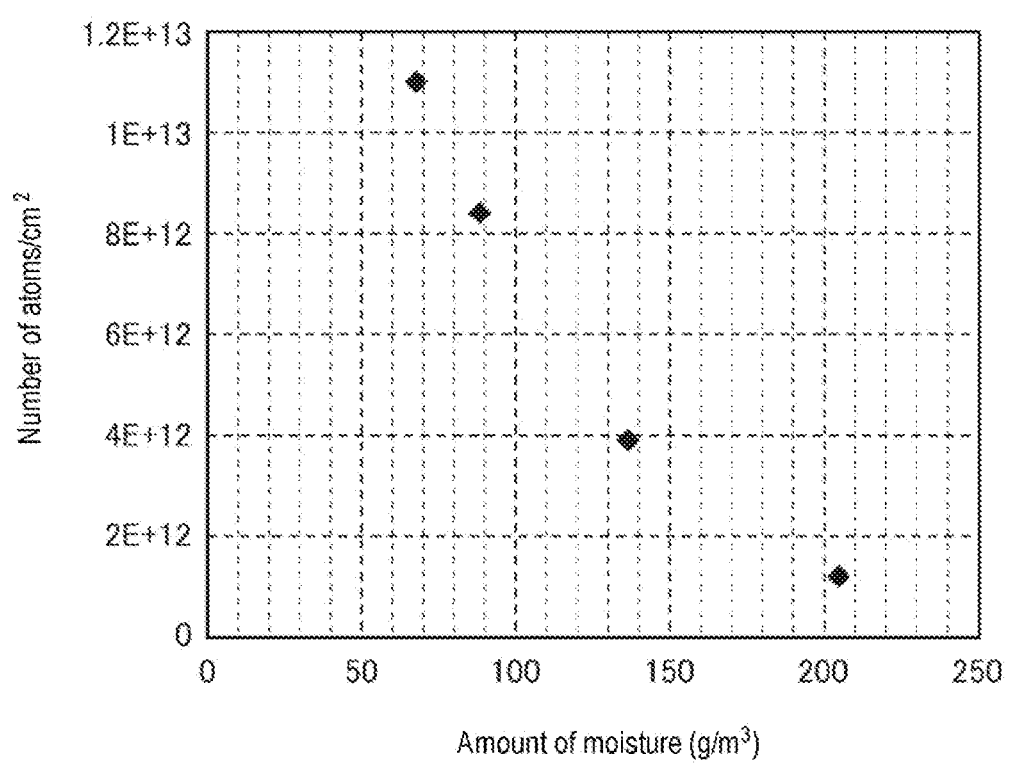
FIG. 5 is a graph depicting the number of residual fluorine atoms when changing an amount of water in atmosphere to which the wafer is exposed.

FIG. 5 is a graph depicting the number of residual fluorine atoms when changing the amount of moisture in the atmosphere to which the wafer is exposed.

As shown in FIG. 5, it was confirmed that, even when the wafer W was heated, the number of residual fluorine atoms was not reduced up to the reference level of the number of residual fluorine atoms in the atmosphere having an amount of moisture of 67.7 g/m³ or less, whereas when the wafer W was heated, the number of residual fluorine atoms was reduced up to the reference level of the number of residual fluorine atoms in the atmosphere having an amount of moisture of 88.5 g/m³ or more.

Further, the present inventors thought that, even in the case where it becomes difficult for moisture to adhere to the surface of the wafer W due to the heating of the wafer W, if a period of time for which the wafer W is exposed to the atmosphere is secured, the coupling between hydrogen and fluorine or the substitution of the silicon-terminating fluorine with the hydroxyl group on the surface of the wafer W is achieved. Thus, the present inventors counted the number of residual fluorine atoms when changing a period of time for which the wafer W subjected to COR and PHT treatments is exposed to the atmosphere. This result is shown in a graph of FIG. 6. Here, the temperature of the wafer W was set to 100 degrees C. by heating the wafer W, the temperature of the atmosphere (the internal temperature of the thermo-hygrostat bath) was set to 55 degrees C., and the amount of moisture of the atmosphere was set to 88.5 g/m$^3$.

Figure 6:
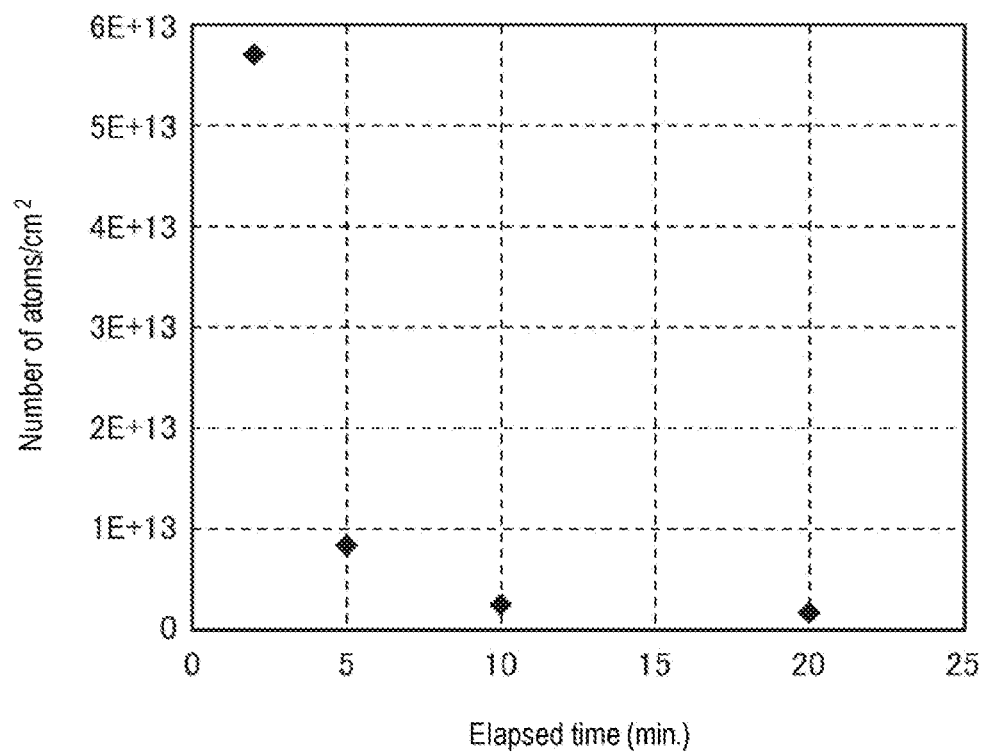
FIG. 6 is a graph depicting the number of residual fluorine atoms when changing a period of time for which the wafer is exposed to a high humidity atmosphere.

FIG. 6 is a graph depicting the number of residual fluorine atoms when changing a period of time for which the wafer is exposed to a high humidity atmosphere.

As shown in FIG. 6, it is confirmed that, even in the case where the wafer W was heated, if the wafer W is exposed to the atmosphere for at least 3 minutes, the number of residual fluorine atoms is reduced up to the reference level of the number of residual fluorine atoms. In addition, the above experiment was performed in a state where the wafer W is accommodated in the thermo-hygrostat bath. In this experiment, after the wafer W is accommodated in the thermo-hygrostat bath, a period of time for which the internal temperature and the amount of moisture of the thermo-hygrostat bath reach a predetermined condition was two minutes. Thus, a period of actual time for which the wafer W is exposed to the high humidity atmosphere in the thermo-hygrostat bath corresponds to a time obtained by subtracting two minutes from each time indicated on the horizontal axis of the graph of FIG. 6.

The present disclosure is based on this finding.

Figure 7:
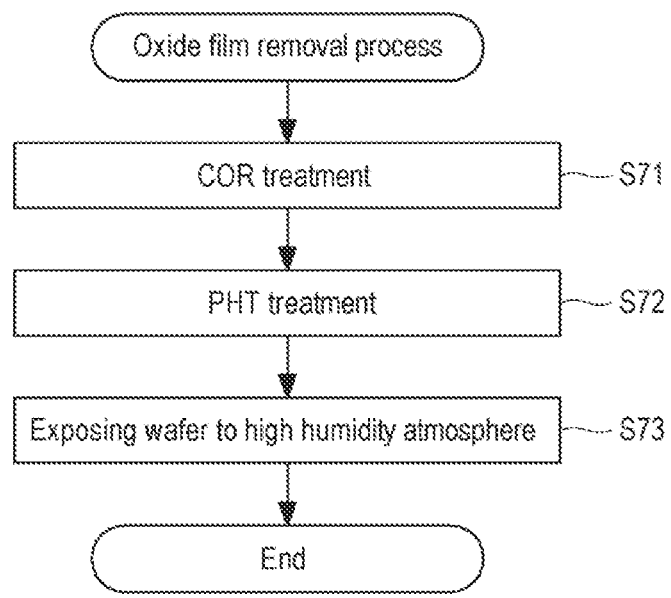
FIG. 7 is a flowchart illustrating an oxide film removal process as a substrate processing method according to one embodiment of the present disclosure.

FIG. 7 is a flowchart illustrating an oxide film removal process as a substrate processing method according to one embodiment of the present disclosure.

In FIG. 7, first, a wafer W is subjected to a COR treatment in one of the process modules 13 (Step S71) (in a first step). Specifically, the wafer W is mounted on the stage 15 inside one of the process modules 13, and subsequently, a process gas containing a hydrogen fluoride gas, an argon gas, an ammonia gas, and a nitrogen gas is introduced into the respective process module 13 such that an oxide film (for example, a silicon dioxide film) formed on a surface of the wafer W reacts with the hydrogen fluoride gas and the ammonia gas. Thus, an ammonium fluorosilicate (AFS) as a reaction product is generated from the oxide film.

Thereafter, the wafer W is subjected to a PHT treatment in another process module 13 (Step S72). Specifically, the wafer W subjected to the COR treatment is taken out of the respective process module 13 and is mounted on the stage 15 inside another one of the process modules 13 by the transfer arm 14. The wafer W mounted on the stage 15 is heated by a heater incorporated in the stage 15. At this time, a temperature of the wafer W is increased to a temperature of, for example, about 120 degrees C. so that the AFS formed on the wafer W is decomposed and sublimated by the heating. However, as shown in FIG. 4A, a single element of fluorine is present on the surface of the wafer W from which the AFS is sublimated, and silicon exposed from the surface of the wafer W by removal of an oxide film is terminated by the fluorine.

Subsequently, the wafer is exposed to a high humidity atmosphere in the cooling storage 20 (Step S73). Specifically, by the transfer arm 14, the wafer W subjected to the PHT treatment is taken out of the another process module 13, carried into the cooling storage 20 through the load lock module 19 and the loader module 18, and mounted on the stage 32. Thereafter, the temperature of the wafer W mounted on the stage 32 is adjusted by the heater 33 and the cooling channel 34 incorporated in the stage 32. For example, the temperature of the wafer W is decreased from about 120 degrees C. to fall within a range of 10 to 80 degrees C., specifically, a range of 24 to 60 degrees C., and the humidity of the process chamber 28 is adjusted by the moisture supply mechanism 29 and the inert gas supply mechanism 30 such that an amount of moisture inside the process chamber 28 is 50 g/m$^3$ or more. At this time, the wafer W is exposed to an atmosphere having the amount of moisture of 50 g/m$^3$ or more for a predetermined period of time, for example, 10 minutes or more (in a second step). Alternatively, for example, the temperature of the wafer W is decreased from about 120 degrees C. to a temperature, specifically 100 degrees C., which is higher than the internal temperature of the process chamber 28 and such that a difference between the temperature of the wafer W and the internal temperature of the process chamber 28 is 50 degrees C. or less. Further, the humidity of the process chamber 28 is adjusted such that the amount of moisture inside the process chamber 28 is 88.5 g/m$^3$ or more. At this time, the wafer W is exposed to an atmosphere having the amount of moisture of 88.5 g/m$^3$ or more for at least 3 minutes or more (in the second step). Here, as show in FIG. 4C, the single element of fluorine present on the surface of the wafer W is coupled to hydrogen to form a hydrogen fluoride, and is then sublimated. Further, the silicon-terminating fluorine present on the surface of the wafer W is substituted with hydrogen or the hydroxyl group. The sublimated hydrogen fluoride or the substituted fluorine is discharged from the interior of the process chamber 28 by the exhaust mechanism 31. In addition, the predetermined period of time depends on the internal environment of the process chamber 28 of the cooling storage 20, specifically, the amount of moisture. Thus, the predetermined period of time is not limited to 10 minutes or more. As an example, the predetermined period of time may be set to be less than 10 minutes as long as the amount of moisture is higher than 50 g/m$^3$.

Thereafter, the wafer W is taken out of the cooling storage 20 and transferred to the FOUP 16 through the loader module 18. In this way, this process is completed.

According to the process of FIG. 7, the wafer W subjected to the COR and PHT treatments is exposed to the atmosphere whose humidity is adjusted to have the amount of moisture of 50 g/m$^3$ or more. Alternatively, the wafer W subjected to the COR and PHT treatments is exposed to the atmosphere whose temperature is higher than the internal temperature of the process chamber 28, in which a difference between the temperature of the wafer W and the internal temperature of the process chamber 28 is 50 degrees C. or less. The humidity of the process chamber 28 is adjusted such that the amount of moisture inside the process chamber 28 is 88.5 g/m$^3$ or more, and in which the humidity is adjusted to have the amount of moisture of 88.5 g/m$^3$ or more. At this time, the single element of fluorine present on the surface of the wafer W is coupled to hydrogen in the moisture to form the hydrogen fluoride. This hydrogen fluoride is sublimated and removed. Further, the silicon-terminating fluorine present on the surface of the wafer W is substituted with hydrogen or the hydroxyl group in the moisture and removed. That is to say, the fluorine present on the wafer W can be removed merely by exposing the wafer W to the atmosphere whose humidity is adjusted to a high value. Thus, there is no need for a plasma generation mechanism or process for removing fluorine. As a result, it is possible to remove the residual fluorine with a simplified configuration without deterioration in throughput.

In the aforementioned process of FIG. 7, as shown in FIG. 4D, silicon present on the surface of the wafer W is terminated and stabilized by hydrogen or the hydroxyl group. As a result, it is possible to suppress the oxide film from being increased again after the process of FIG. 7. Typically, in order to avoid the oxide film from being generated again due to a natural oxidation after the wafer is subjected to an oxide film removal process, there is a need to manage, specifically, reduce, a period of time spent from the oxide film removal process to a subsequent process. On the other hand, in the process of FIG. 7, as described above, it is possible to suppress the oxide film from being generated again after the process of FIG. 7. This eliminates the need to manage a period of time from the process of FIG. 7 to the subsequent process, thereby reducing a load borne by a user of the substrate processing system 10.

Further, in the aforementioned process of FIG. 7, the residual fluorine is removed during cooling of the wafer in the cooling storage 20. This eliminates the need to individually perform the cooling process of the wafer W and the removal process of the residual fluorine, which makes it possible to reliably prevent deterioration in throughput.

In the aforementioned process of FIG. 7, in the cooling storage 20, the adjustment of the amount of internal moisture of the process chamber 28 by the moisture supply mechanism 29 and the inert gas supply mechanism 30 and the discharge of the internal atmosphere of the process chamber 28 by the exhaust mechanism 31 may be repeated. With this configuration, it is possible to frequently remove the hydrogen fluoride sublimated from the surface of the wafer W or the substituted fluorine on the surface of the wafer W, thereby keeping the concentration of fluorine on the surface of the wafer W at a very low level. As a result, it is possible to reduce a likelihood that the substituted fluorine adheres to the surface of the wafer W again or fluorine in the hydrogen fluoride terminates silicon again.

Furthermore, although the wafer W subjected to the COR and PHT treatments has been described to be exposed to the moisture-containing atmosphere in the aforementioned process of FIG. 7, the atmosphere may contain a hydroxyl group or hydrogen. For example, even when the wafer W is exposed to alcohol containing a hydroxyl group or hydrogen, for example, an atmosphere containing ethanol, methanol, propanol or butanol, this provides the same effects as the embodiments of the present disclosure. On the other hand, moisture may adhere to the surface of the wafer W exposed to the moisture-containing atmosphere and the moisture may remain on the surface in-situ without evaporating. Thus, the wafer W from which the residual fluorine is removed by the process of FIG. 7, may be dried by a dry module which is installed in the substrate processing system 10 or installed in a separate place.

Furthermore, although in the aforementioned process of FIG. 7, the residual fluorine present on the wafer W has been described to be removed in the cooling storage 20 of the substrate processing system 10, the cooling storage 20 may be installed separately from the substrate processing system 10 and the residual fluorine present on the wafer W may be removed by exposing the wafer W to a high humidity atmosphere inside the separate cooling storage 20. In some embodiments, in the process of FIG. 7, the wafer subjected to the PHT treatment may be directly transferred to the FOUP 16 while bypassing the cooling storage 20. In the FOUP 16, the residual fluorine present on the wafer W may be removed by adjusting an internal humidity and temperature of the FOUP 16.

Although the COR treatment has been described to be performed as a treatment using a fluorine-containing gas in the aforementioned process of FIG. 7, the treatment using a fluorine-containing gas is not limited to the COR treatment. For example, the treatment may use a fluorine plasma generated from a fluorine-containing gas. Further, the treatment is not limited to a film removal process and may include an etching process or a film forming process. Even in any treatment, it is possible to remove the residual fluorine by exposing the wafer W to a high humidity atmosphere while adjusting the temperature of the wafer W in the cooling storage 20.

While certain embodiments have been described, the present disclosure is not limited thereto.

Moreover, the present disclosure may be achieved by providing a memory medium that stores a program code of software for implementing respective functions of the above embodiments to a computer equipped with the substrate processing system 10, and by allowing a central processing unit (CPU) of the controller 27 to read and execute the program code stored in the memory medium.

In such a case, the program code itself which read from the memory medium implements the respective functions of the above embodiments, and the program code and the memory medium that stores the program code constitute the present disclosure.

In addition, examples of the memory medium for providing the program code may include RAM, NV-RAM, a floppy (registered mark) disk, a hard disk, an optomagnetic disk, an optical disk such as CD-ROM, CD-R, CD-RW and DVD (DVD-ROM, DVD-RAM, DVD-RW, DVD+RW), a magnetic tape, a nonvolatile memory card, and other ROMs, which are capable of storing the program code. Alternatively, the program code may be provided to the controller 27 by downloading from another computer and data base (both not shown) which are connected to an internet, a commercial network, a local area network or the like.

Further, the respective functions of the above embodiments may be implemented by executing the program code which is read by the controller 27, and by allowing an OS (operating system) running on the CPU to execute some or all of the actual processes based on an instruction of the program code.

Further, the respective functions of the above embodiments may be implemented by writing the program code read from the memory medium into a memory provided in a function expansion board inserted into the controller 27 or a function expansion unit connected to the controller 27, and by allowing a CPU or the like provided in the function expansion board or the function expansion unit to execute some or all of the actual processes based on an instruction of the program code.

The program code may be configured in a form such as an object code, a program code executed by an interpreter, a script data provided to the OS, or the like.

According to the present disclosure in some embodiments, a substrate subjected to a treatment using a fluorine-containing gas is exposed to a moisture-containing atmosphere. Fluorine is coupled to hydrogen in the moisture to form a hydrogen fluoride, which is sublimated and removed. In addition, fluorine which terminates silicon on a surface of the substrate is substituted with hydrogen or a hydroxyl group in the moisture and is then removed. That is to say, it is possible to remove the fluorine merely by exposing the substrate to the moisture-containing atmosphere. This eliminates the need to prepare a mechanism or process for generating plasma. As a result, it is possible to remove a residual fluorine in a simplified configuration without deteriorating throughput.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system, comprising:
   at least one chemical oxide removal (COR) module configured to perform a COR process on a substrate having a silicon oxide film formed on the substrate;
   at least one post heat treatment (PHT) module configured to perform a PHT process on the substrate processed in the at least one COR module;
   at least one load lock module;
   a vacuum transfer module configured to transfer the substrate among the at least one COR module, the at least one PHT module, and the at least one load lock module;
   a post process module configured to remove residual fluorine on the substrate processed in the at least one PHT module under an atmosphere kept at atmospheric pressure, the post process module including:
      a substrate stage disposed in the post process module;
      a temperature adjustment mechanism configured to adjust a temperature of the substrate mounted on the substrate stage;
      a moisture supply mechanism configured to supply water vapor into the post process module; and
      an inert gas supply mechanism configure to supply an inert gas into the post process module;
   an atmospheric transfer module configured to transfer the substrate from the at least one load lock module to the post process module; and
   a controller programmed to execute:
      transferring, by the vacuum transfer module, the substrate to the at least one COR module to perform the COR process on the substrate in the at least one COR module;
      transferring, by the vacuum transfer module, the substrate from the at least one COR module to the at least one PHT module to perform the PHT process on the substrate in the at least one PHT module;
      transferring, by the vacuum transfer module, the substrate from the at least one PHT module to the at least one load lock module; and
      transferring, by the atmospheric transfer module, the substrate from the at least one load lock module to the post process module to remove the residual fluorine on the substrate in the post process module,
   wherein the controller is further programmed to execute setting an amount of moisture contained in the atmosphere in the post process module to be 88.5 $g/m^3$ by the moisture supply mechanism and the inert gas supply mechanism, and exposing the substrate to the atmosphere in the post process module for three minutes or more and less than ten minutes.

2. The substrate processing system of claim 1, wherein in the post process module, the substrate is kept at a temperature having a range of 10 to 80 degrees C.

3. The substrate processing system of claim 2, wherein in the post process module, the substrate is kept at a temperature having a range of 24 to 60 degrees C.

4. The substrate processing system of claim 1, wherein in the at least one COR module, a chemical oxide removal (COR) treatment is performed by a fluorine-containing gas.

5. The substrate processing system of claim 1, wherein the temperature adjustment mechanism of the post process module includes a heater and a cooling channel, which are provided in the substrate stage, and
   wherein in the post process module, by the heater and the cooling channel, the temperature of the substrate is adjusted to be higher than a temperature of the atmosphere in the post process module, and a difference in temperature between the substrate and the atmosphere in the post process module falls within 50 degrees C. or less.

* * * * *